US011296093B2

(12) United States Patent
Regev et al.

(10) Patent No.: US 11,296,093 B2
(45) Date of Patent: Apr. 5, 2022

(54) DEEP TRENCH CAPACITOR DISTRIBUTION

(71) Applicant: INTERNATIONAL BUSINESS MACHINES CORPORATION, Armonk, NY (US)

(72) Inventors: Asaf Regev, Ramat Gan (IL); Christopher Berry, Hudson, NY (US); Ofer Geva, Poughkeepsie, NY (US); Amit Amos Atias, Tel Aviv (IL); Timothy A. Schell, Cary, NC (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 15 days.

(21) Appl. No.: 16/804,062

(22) Filed: Feb. 28, 2020

(65) Prior Publication Data

US 2021/0272963 A1    Sep. 2, 2021

(51) Int. Cl.
*H01L 27/108*    (2006.01)
*H01L 29/66*    (2006.01)
*H01L 49/02*    (2006.01)

(52) U.S. Cl.
CPC .. *H01L 27/10894* (2013.01); *H01L 27/10897* (2013.01); *H01L 28/40* (2013.01); *H01L 29/66181* (2013.01)

(58) Field of Classification Search
CPC ............... H01L 27/10894; H01L 28/40; H01L 29/66181; H01L 27/10897
See application file for complete search history.

(56) References Cited

U.S. PATENT DOCUMENTS

| | | | |
|---|---|---|---|
| 6,232,154 B1 * | 5/2001 | Reith | ................... H01L 28/40 438/129 |
| 6,551,895 B1 | 4/2003 | Hsu et al. | |
| 6,613,672 B1 | 9/2003 | Wang et al. | |
| 10,289,790 B2 * | 5/2019 | Heilprin | ................ G06F 30/367 |
| 2021/0296315 A1 * | 9/2021 | Lilak | ................... H01L 21/8221 |

FOREIGN PATENT DOCUMENTS

CN    102956818 B    6/2016

* cited by examiner

*Primary Examiner* — Edward Chin
(74) *Attorney, Agent, or Firm* — Cantor Colburn LLP; Jeffrey Ingalls

(57) ABSTRACT

A method for distributing deep trench (DT) capacitance in an integrated circuit (IC) design is provided. The method includes forming a placement block that includes blockages defining openings in interstitial regions among the blockages, superimposing the placement block over the IC design and providing distributed DT capacitance to the IC design. The providing of the distributed DT capacitance includes adding DT capacitance cells through the openings to portions of the IC design where there are no reserved blocks.

16 Claims, 6 Drawing Sheets

DEEP TRENCH CAPACITOR DISTRIBUTION

BACKGROUND

The present invention generally relates to large macro fabrication and, more specifically, to methods for distributing deep trench (DT) capacitance in a large macro block during a fabrication stage while leaving space for engineering change orders (ECOs).

There are generally three aspects of power integrity that can be addressed at a chip level. These include changing integrated circuit (IC) power consumption during one clock cycle, changing IC power consumption over longer time periods, and voltage drops along current paths from a power supply to the IC. Since a rate of computations is often time-varying, the power and current requirements of the IC can vary with time. Thus, delivering a time-varying current at a constant supply voltage with nominal variations is a goal of power distribution network design in a chip. In order to prevent chip voltage levels from dropping under a minimum voltage level, capacitors are located at different places across the system including, in particular, places associated with switching logic.

SUMMARY

Embodiments of the present invention are directed to a method for distributing deep trench (DT) capacitance in an integrated circuit (IC) design. A non-limiting example of the method includes forming a placement block that includes blockages defining openings in interstitial regions among the blockages, superimposing the placement block over the IC design and providing distributed DT capacitance to the IC design. The providing of the distributed DT capacitance includes adding DT capacitance cells through the openings to portions of the IC design where there are no reserved blocks.

Embodiments of the present invention are directed to a method for distributing deep trench (DT) capacitance in an integrated circuit (IC) design including reserved blocks. A non-limiting example of the method includes forming a placement block that includes blockages defining openings in interstitial regions among the blockages without regard to respective positions of the reserved blocks, superimposing the placement block over the IC design and providing distributed DT capacitance to the IC design. The providing of the distributed DT capacitance includes substantially evenly adding DT capacitance cells through the openings to portions of the IC design where there are no reserved blocks.

Embodiments of the present invention are directed to an integrated circuit (IC) design. A non-limiting example of the IC design includes a surface, reserved blocks disposed on the surface and distributed DT capacitance cells substantially evenly disposed on portions of the surface where there are no reserved blocks.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagrams or the operations described therein without departing from the spirit of the invention. For instance, the actions can be performed in a differing order or actions can be added, deleted or modified. Also, the term "coupled" and variations thereof describe having a communications path between two elements and do not imply a direct connection between the elements with no intervening elements/connections between them. All of these variations are considered a part of the specification.

DETAILED DESCRIPTION

One or more embodiments of the present invention provide for effectively filling large blocks of space in an integrated circuit (IC) with substantially evenly distributed deep trench (DT) capacitance while leaving space for engineering change order (ECO) cells. This can be achieved by taking an auto-routed view of the IC and removing all fillers, placing placement blockages with a pattern that leaves empty space for latch banks/fillbuf cells over the IC, adding the DT capacitance, removing the blockages and adding the fillers back.

During IC fabrication it is often found that providing an IC with distributed capacitance to avoid voltage drops while at the same time leaving room for engineering change orders (ECOs) is difficult.

The following description provides for a method for distributing DT capacitors in a large macro, while leaving enough space for ECO changes. The method includes leaving manual added DT cells around embedded-IP and getting a full distribution of DT capacitance. That is, the method allows for a manipulation of DT distribution while enabling insertion of ECO cells for easier and smarter ECO phases. By adding the DT capacitance through empty spaces, insertion of local clock buffers (LCBs), latches and big ECO buffers are enabled.

Figure 1:
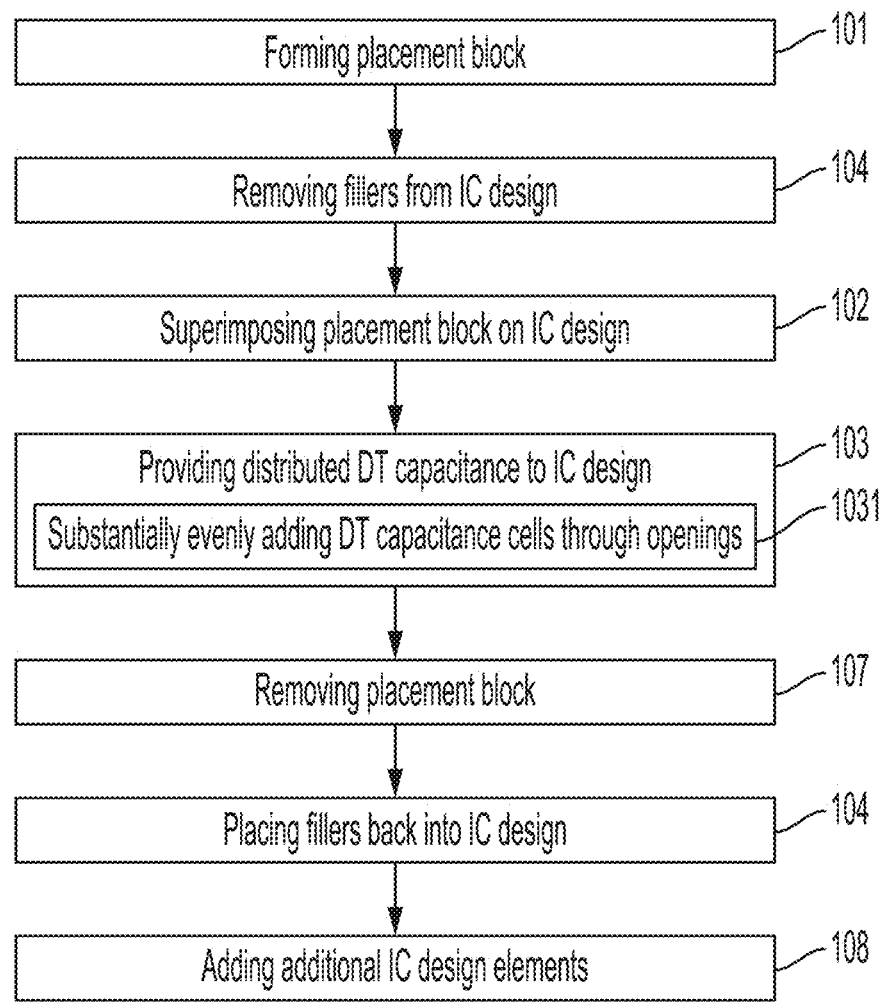
FIG. 1 is a flow diagram illustrating a method for distributing deep trench (DT) capacitance in an integrated circuit (IC) design in accordance with one or more embodiments of the present invention.

Turning now to FIG. 1, a method for distributing DT capacitance in an IC design is provided where the IC design includes reserved blocks, such as blocks of memory cells, and preplaced DT cells that generally surround the reserved blocks. As shown in FIG. 1, the method includes forming a placement block (101) such that the placement block includes blockages, which define openings in interstitial regions among the blockages. The positioning of the blockages and the openings in the placement block can be set without regard to respective positions of the reserved blocks and the preplaced DT capacitance cells of the IC. In addition, respective sizes of the blockages can be set or can be based on sizes of gates of the IC design (e.g., on the order of about 14 nm). The method further includes superimposing the placement block over the IC design (102) so that the openings in the placement block reveal certain portions of the IC design that include portions of reserved blocks, certain portions of the IC design that include portions of preplaced DT cell and certain portions of the IC design that include no portions of reserved blocks and no portions of preplaced DT cells. The method also includes providing distributed DT capacitance to the IC design (103) where the providing of the DT capacitance to the IC design is accomplished by substantially evenly adding DT capacitance cells through the openings in the placement block to those certain portions of the IC design where there are no reserved blocks or preplaced DT capacitance cells (1031).

In accordance with embodiments of the present invention, the forming of the placement block of operation 101 can be executed such that the blockages and the openings are arranged in a matrix or matrix-like formation. In these or other cases, the blockages can be arranged in rows and columns of blockages. The openings defined in the interstitial regions between the blockages can be similarly arranged in rows and columns.

In accordance with embodiments of the present invention, the method can also include removing fillers from the IC design prior to the providing of the distributed DT capacitance of operation 103 (104) and adding the fillers back into the IC design following the providing of the distributed DT capacitance of operation 103 (105). In any case, once the distributed DT capacitance is provided in operation 103, the method can further include removing the placement block (106) and adding additional IC design elements to the IC design provided with the distributed DT capacitance (107). In accordance with embodiments of the present invention, the additional IC design elements can include, but are not limited to, buffers, local clock buffers, latches and ECO buffers.

Figure 2:
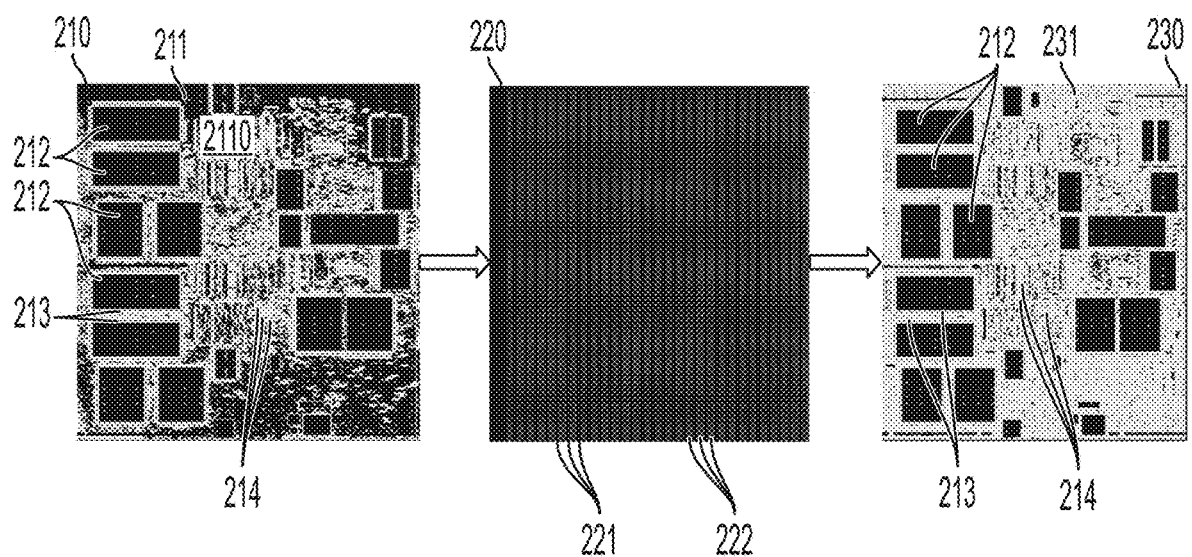
FIG. 2 is a graphical illustration of the method of FIG. 1 in accordance with one or more embodiments of the present invention.

With reference to FIG. 2, certain details of the operations of the method of FIG. 1 are illustrated. These include an IC design 210, a placement block 220 and an IC design provided with the distributed DT capacitance (hereinafter referred to as a "modified IC design") 230.

The IC design 210 includes a substrate 211, reserved blocks 212, preplaced DT capacitance cells 213 and fillers 214. The substrate 211 has a major surface 2110 with certain height and width dimensions. The reserved blocks 212 can include blocks of memory cells among other types of features and are distributed at various locations across the major surface 2110. The preplaced DT capacitance cells 213 are also distributed at various locations across the major surface 2110 but are additionally disposed to generally surround the reserved blocks 212. In this way, since the reserved blocks 212 are immovable, the preplaced DT capacitance cells 213 are positioned to provide the IC design 210 (and ultimately the modified IC design 230) with sufficient localized capacitance. The fillers 214 are unevenly distributed over the major surface 2110 where there are no reserved blocks 212 or preplaced DT capacitance cells 213.

The placement block 220 can have, but is not required to have, substantially similar height and width dimensions as the IC design 210 and includes blockages 221. The blockages 221 are formed to defined openings 222 in interstitial regions between the blockages 221. In accordance with embodiments of the present invention, the blockages 221 can be arranged in a matrix or matrix-like formation 223 in which the blockages 221 are disposed in rows and columns and the openings 222 are similarly defined in rows and columns.

As a general matter, the placement block 220 should be sized so that, when the placement block 220 is superimposed over the IC design 210, the openings 222 are substantially evenly distributed across an entirety of the major surface 2110. Also, sizes and dimensions of the blockages 221 are provided such that the openings 222 are separated from one another by distances which would allow for the eventual placement of gates of the IC design between DT capacitance cells (e.g., on the order of about 14 nm).

The modified IC design 230 is obtained by substantially evenly adding DT capacitance cells 231 through the openings 222 in the placement block 220 to those certain portions of the major surface 2110 of the IC design 210 where there are no reserved blocks 212 or preplaced DT capacitance cells 213. The modified IC design 230 can also be obtained by removing the fillers 214 prior to the additions of the DT capacitance cells 231 and then placing the fillers 214 back into the modified IC design 230 following the additions of the DT capacitance cells 231.

Since the DT capacitance cells 231 are added through the openings 222 in the placement block 220, a distribution of the DT capacitance cells 231 is substantially even across the major surface 2110 and thus adds to the capacitance provided by the preplaced DT capacitance cells 213. Moreover, since the positioning of the DT capacitance cells 231 is dependent upon the distribution or concentration of the blockages 221/openings 222 in the placement block 220, the fillers 214 can be placed back into the modified IC design 230 as fill-buffers and ECOs can be added into the modified IC design 230 as needed between the DT capacitance cells 231.

Figure 3:
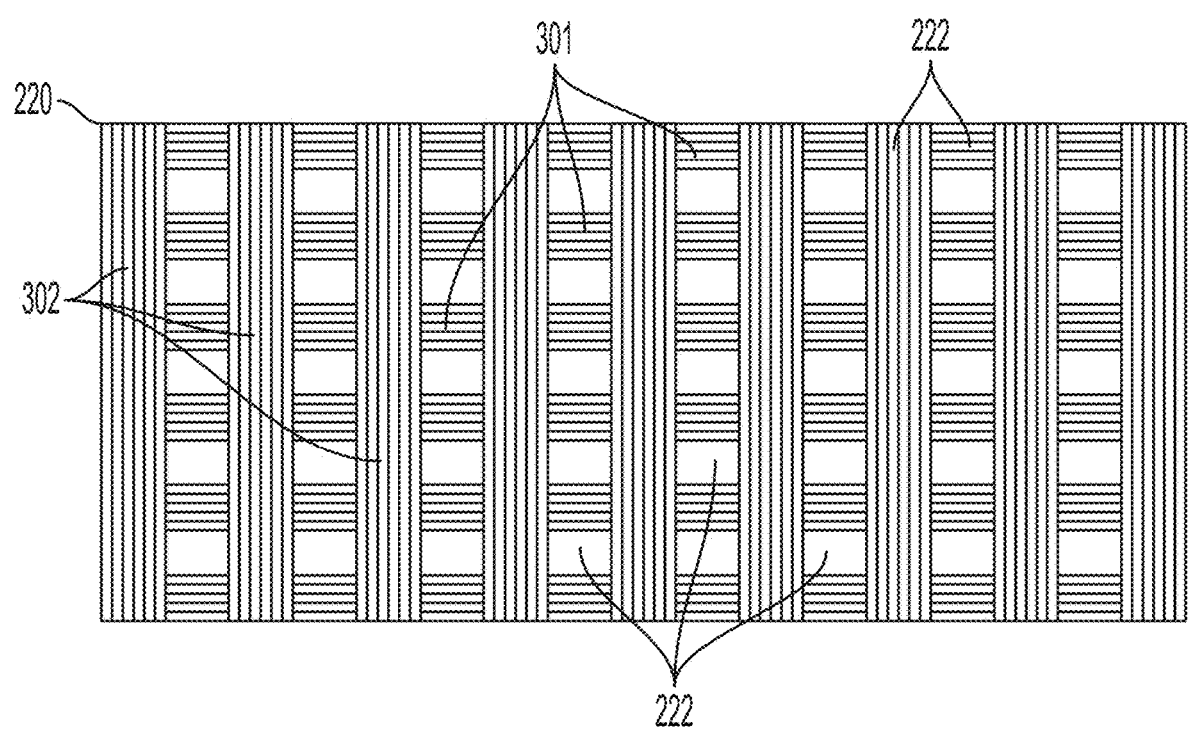
FIG. 3 is an enlarged schematic view of a portion of a placement block in accordance with one or more embodiments of the present invention.

With reference to FIG. 3 and in accordance with embodiments of the present invention, a portion of a placement block 220 is illustrated. As shown in FIG. 3, the portion of the placement block 220 includes rows 301 of blockages 221 and columns 302 of blockages 221 such that the rows 301 of blockages 221 and the columns 302 of blockages 221 form the openings 222 in the interstitial regions between the blockages 221. In addition, it is to be understood that the respective sizes of the openings 222 and the respective distances between adjacent or neighboring openings 222 can set or can be based on sizes of gates of the IC design 210 and the modified IC design 230. In this way, for example, gates needed for certain ECOs can be added to the modified IC design 230.

While the placement block 220 has been described above and illustrated in FIG. 3 as a unitary feature, it is to be understood that this is not required and that embodiments exist in which the placement block 220 is provided as plural placement blocks that are designed for use with various portions of the IC design 210. Also, while the adding of the DT capacitance cells 231 through the openings has been described above as taking place during a single processing stage, it is to be understood that this is not required and that embodiments exist in which the adding of the DT capacitance cells 231 occurs during the course of multiple processing stages.

In particular, in a case in which the placement block 220 is provided as plural placement blocks, DT capacitance cells 231 can be added through each one of the plural placement blocks in sequence. That is, one placement block could be superimposed on the IC design 210 and DT capacitance cells 231 can be added through its openings. Subsequently, that one plural block can be removed and replaced by another. This process can be repeated multiple times until the desired distribution of DT capacitance is achieved.

Figure 4:
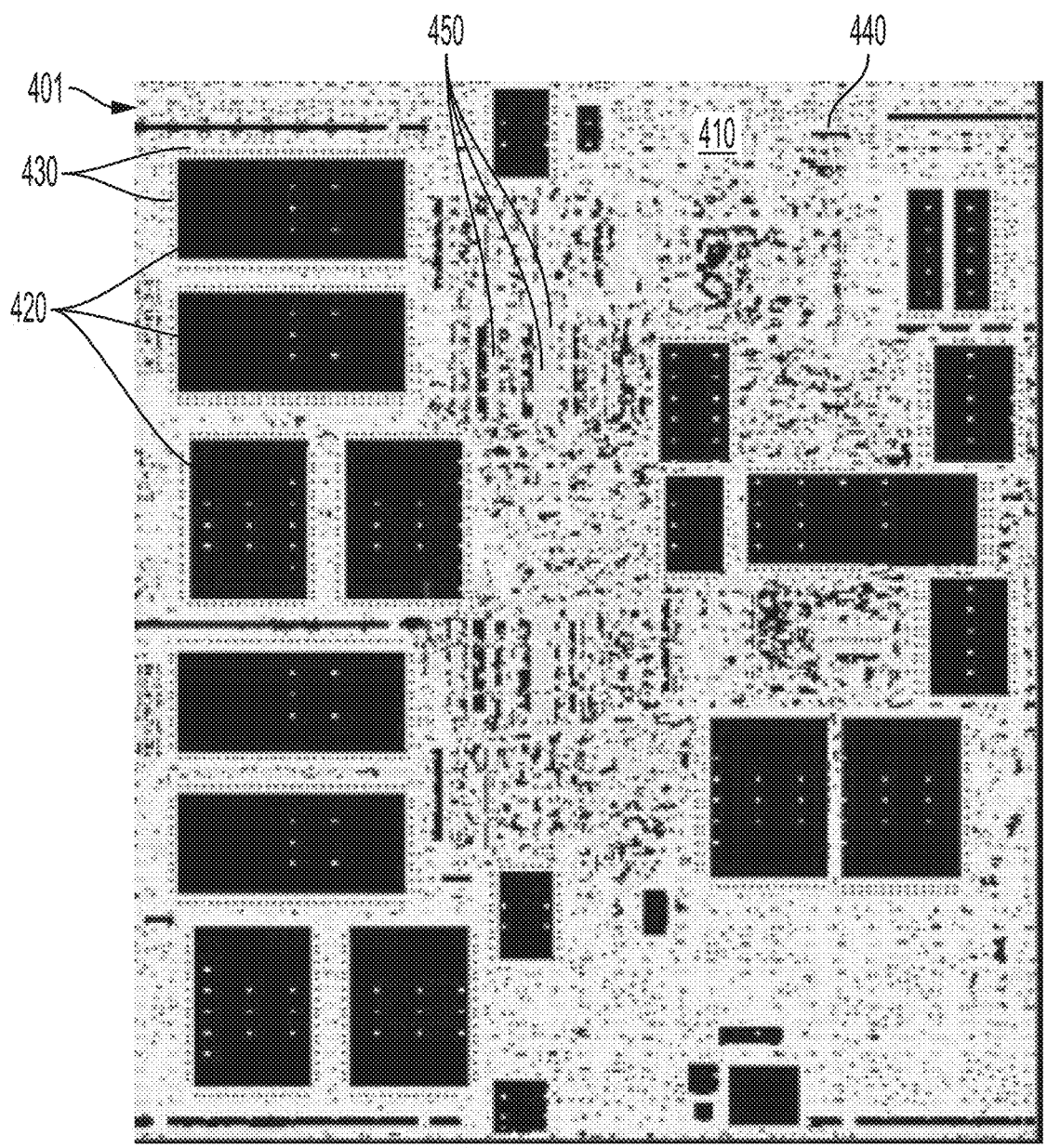
FIG. 4 is a schematic top-down view of a modified IC design including distributed DT capacitance in accordance with one or more embodiments of the present invention.

With reference to FIG. 4, an enlarged view of the modified IC design 230 of FIG. 2 is illustrated as a modified (or late stage) IC design 401. As shown in FIG. 4, the modified IC design 401 includes a surface 410, reserved blocks 420 disposed on the surface 410, preplaced DT capacitance cells 430 and distributed DT capacitance cells 440. The reserved blocks 420 can include blocks of memory cells and are immovable with respect to the surface 410. The preplaced DT capacitance cells 430 are disposed on the surface 410 to generally surround the reserved blocks 420 and thus provide for localized capacitance for the reserved blocks 420. The distributed DT capacitance cells 440 can be constructed similarly as the preplaced DT capacitance cells 430 and are substantially evenly disposed on portions of the surface 410 where there are no reserved blocks 420 or preplaced DT capacitance 430. The distributed DT capacitance cells 440 thus provide the modified IC design 401 with additional distributed DT capacitance. An even distribution of the DT capacitance cells 440 is based on sizes of gates of the modified IC design 401.

In accordance with embodiments of the present invention, the modified IC design 401 can further include fillers, IC design elements and ECO cells 450.

Figure 5:
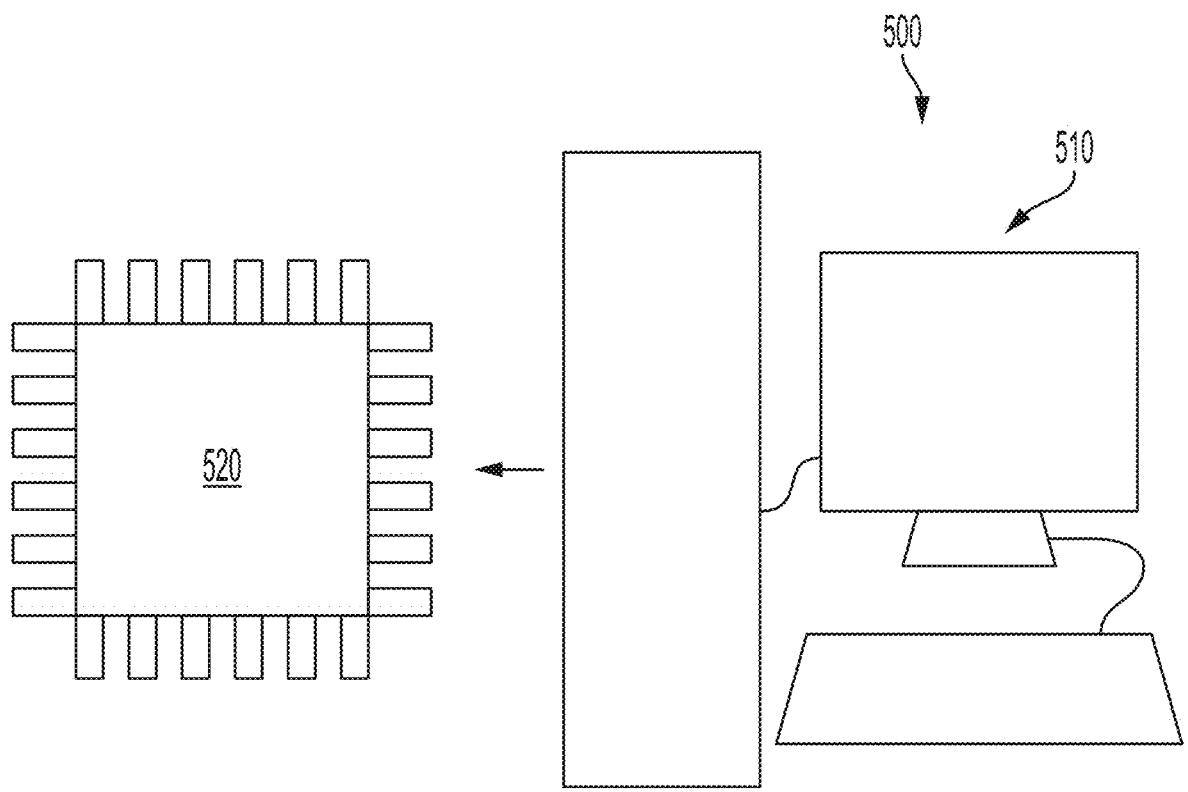
FIG. 5 is a schematic diagram of a system to perform a distribution of DT capacitance in the IC in accordance with one or more embodiments of the present invention.
Figure 6:
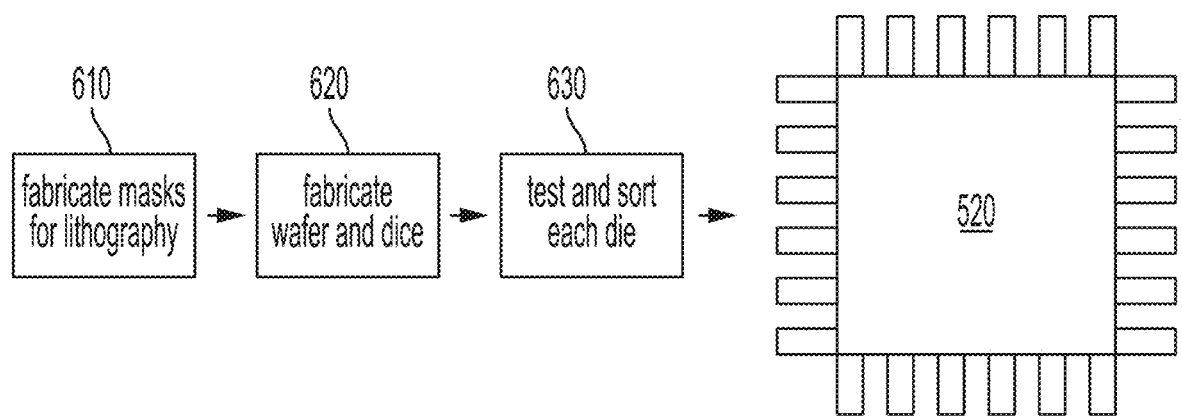
FIG. 6 is a process flow of a method of fabricating the IC according to one or more embodiments of the present invention.

With reference to FIGS. 5 and 6, additional features will now be described.

FIG. 5 is a block diagram of a system 500 to perform a distribution of DT capacitance in an IC according to one or more embodiments of the present invention. The system 500 includes processing circuitry 510 used to generate the design that is ultimately fabricated into the IC 520. The operations involved in the fabrication of the IC 520 are well-known and briefly described herein. Once the physical layout is finalized, based, in part, on the distribution of the DT capacitance according to one or more embodiments of the present invention to facilitate optimization of the routing plan, the finalized physical layout is provided to a foundry. Masks are generated for each layer of the IC 520 based on the finalized physical layout. Then, the wafer is processed in the sequence of the mask order. The processing includes photolithography and etch. This is further discussed with reference to FIG. 6.

FIG. 6 is a process flow of a method of fabricating the IC 520 according to one or more embodiments of the present invention. Once the physical design data is obtained, based, in part, on the distribution of the DT capacitance, the IC 520 can be fabricated according to known processes that are generally described with reference to FIG. 6. Generally, a wafer with multiple copies of the final design is fabricated and cut (i.e., diced) such that each die is one copy of the IC 520. At block 610, the processes include fabricating masks for lithography based on the finalized physical layout. At block 620, fabricating the wafer includes using the masks to perform photolithography and etching. Once the wafer is diced, testing and sorting each die is performed, at block 630, to filter out any faulty die.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

One or more of the methods described herein can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for distributing deep trench (DT) capacitance in an integrated circuit (IC) design, the method comprising:
    forming a placement block comprising blockages defining openings in interstitial regions among the blockages;
    superimposing the placement block over the IC design; and
    providing substantially evenly distributed DT capacitance to an entirety of the IC design except for at locations of reserved blocks by adding DT capacitance cells through the openings to those portions of the IC design where there are no reserved blocks.

2. The method according to claim 1, wherein the reserved blocks comprise blocks of memory cells.

3. The method according to claim 1, wherein sizes and distributions of the blockages are based on sizes of gates of the IC design.

4. The method according to claim 1, wherein the blockages are arranged in a matrix pattern.

5. The method according to claim 1, further comprising:
    removing fillers from the IC design prior to the providing of the distributed DT capacitance; and
    adding the fillers back into the IC design following the providing of the distributed DT capacitance.

6. The method according to claim 1, further comprising:
    removing the placement block; and
    adding additional IC design elements to the IC design provided with the distributed DT capacitance.

7. The method according to claim 6, wherein the additional IC design elements comprise buffers, local clock buffers, latches and engineering change order (ECO) buffers.

8. The method according to claim 1, further comprising inserting engineering change order (ECO) cells to the IC design provided with the distributed DT capacitance.

9. A method for distributing deep trench (DT) capacitance in an integrated circuit (IC) design comprising reserved blocks, the method comprising:
    forming a placement block comprising blockages defining openings in interstitial regions among the blockages without regard to respective positions of the reserved blocks;
    superimposing the placement block over the IC design; and
    providing substantially evenly distributed DT capacitance to an entirety of the IC design except for at locations of reserved blocks by substantially evenly adding DT capacitance cells through the openings to those portions of the IC design where there are no reserved blocks.

10. The method according to claim 9, wherein the reserved blocks comprise blocks of memory cells.

11. The method according to claim 9, wherein sizes and distributions of the blockages are based on sizes of gates of the IC design.

12. The method according to claim 9, wherein the blockages are arranged in a matrix pattern.

13. The method according to claim 9, further comprising:
    removing fillers from the IC design prior to the providing of the distributed DT capacitance; and
    adding the fillers back into the IC design following the providing of the distributed DT capacitance.

14. The method according to claim 9, further comprising:
    removing the placement block; and
    adding additional IC design elements to the IC design provided with the distributed DT capacitance.

15. The method according to claim 14, wherein the additional IC design elements comprise buffers, local clock buffers, latches and engineering change order (ECO) buffers.

16. The method according to claim 9, further comprising inserting engineering change order (ECO) cells to the IC design provided with the distributed DT capacitance.

* * * * *